(12) United States Patent
Kalnitsky et al.

(10) Patent No.: US 6,475,873 B1
(45) Date of Patent: Nov. 5, 2002

(54) METHOD OF FORMING LASER TRIMMABLE THIN-FILM RESISTORS IN A FULLY PLANARIZED INTEGRATED CIRCUIT TECHNOLOGY

(75) Inventors: Alexander Kalnitsky; Robert F. Scheer, both of Portland, OR (US); Joseph P. Ellul, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 75 days.

(21) Appl. No.: 09/631,581

(22) Filed: Aug. 4, 2000

(51) Int. Cl.[7] .................. H01L 21/20; H01L 23/62; H01L 29/76
(52) U.S. Cl. ................ 438/384; 438/382; 438/385; 257/359; 257/379; 257/516
(58) Field of Search .................. 438/384, 385, 438/382, 381, 330, 329, 171, 238; 257/359, 363, 379, 516, 904

(56) References Cited

U.S. PATENT DOCUMENTS

| | | | | |
|---|---|---|---|---|
| 3,574,932 A | * | 4/1971 | Wilson | 29/620 |
| 4,179,310 A | * | 12/1979 | Compton et al. | 438/186 |
| 4,468,414 A | * | 8/1984 | Van Vonno | 438/385 |
| 4,594,265 A | * | 6/1986 | Van Vonno et al. | 438/385 |
| 4,704,188 A | * | 11/1987 | Carlson et al. | 216/16 |
| 4,708,747 A | * | 11/1987 | O'Mara, Jr. | 438/384 |
| 4,839,711 A | * | 6/1989 | O'Mara, Jr. | 257/524 |
| 5,179,434 A | * | 1/1993 | Hiruta | 257/754 |
| 5,367,284 A | * | 11/1994 | Morris | 338/306 |
| 5,414,404 A | * | 5/1995 | Jeong et al. | 338/307 |
| 5,525,831 A | * | 6/1996 | Ohkawa et al. | 257/543 |
| 6,316,325 B1 | * | 11/2001 | Lee | 438/384 |
| 2001/0017397 A1 | * | 8/2001 | Lee | 257/536 |

* cited by examiner

Primary Examiner—Matthew Smith
Assistant Examiner—Lex H. Malsawma
(74) Attorney, Agent, or Firm—Blakely, Sokoloff, Taylor & Zafman LLP

(57) ABSTRACT

A new and improved method of forming a thin film resistor is provided herein that overcomes many of the drawbacks of prior art methods. More specifically, the new method of forming a thin film provides for a well-controlled dielectric thickness under the thin film resistor which is useful for laser trimming purpose. The preferred thickness of the dielectric layer is an integer of a quarter wavelength of the optical energy used to laser trim the resistor. The new method also provides contacts to the thin film resistor that do not directly contact the thin film resistor so as to prevent any adverse process effects to the thin film resistor. More specifically, the method of forming a thin film resistor includes the steps of forming a pair of spaced-apart polysilicon islands over a semiconductor substrate, forming a dielectric layer over and between the polysilicon islands, forming contact holes through the dielectric layer to expose respective first regions of the polysilicon islands, forming a layer of thin film resistive material that extends between respective first regions of the polysilicon islands, forming another dielectric layer over the polysilicon islands and over the thin film resistive material layer, and forming metal contacts through the second dielectric layer in a manner that they make contact to respective second regions of the polysilicon islands, wherein the first and second regions of the polysilicon islands are different.

29 Claims, 3 Drawing Sheets

METHOD OF FORMING LASER TRIMMABLE THIN-FILM RESISTORS IN A FULLY PLANARIZED INTEGRATED CIRCUIT TECHNOLOGY

FIELD OF THE INVENTION

This invention relates generally to semiconductor processing, and in particular, to a method of forming a thin film resistor disposed on an underlying dielectric layer having a well-controlled thickness useful for reliable laser trimming.

BACKGROUND OF THE INVENTION

Thin film resistors are employed in many integrated circuits. Thin film resistors are used in integrated circuit to implement the desired functionality of the circuit, including biasing of active devices, serving as voltage dividers, assisting in impedance matching, etc. They are typically formed by deposition of a resistive material on a dielectric layer, and subsequently patterned to a desired size and shape. Deposition of the resistive material can be performed by any deposition means, such as by sputtering. Often, a thin film resistor is subjected to a heat treatment process (i.e. annealing) to improve its stability and to bring the resistance to a desired value.

Generally, obtaining a precise resistance value for a thin film resistance is not a straightforward process. First, the resistive material, size and shape of a thin film resistor are typically selected so that the overall resistance is slightly below its final value. Then, the thin film resistor undergoes an annealing process to raise the resistance up to its final value. However, the desired resistance value for the thin film resistor may not be achieved using this process. As a result, laser trimming is performed on the thin film resistor while measuring the resistance, or another circuit parameter associated with the resistance, to precisely set the thin film resistor at the desired value. In order to precisely laser trim a thin film resistor, a high degree of thickness control is typically necessary for the dielectric layer to which the thin film resistor is disposed on.

FIG. 1 illustrates a portion of an exemplary integrated circuit 100 having a thin film resistor formed in a conventional manner. The integrated circuit 100 consists of a silicon substrate 102, a local oxidation of silicon (LOCOS) layer 104, a glass layer 106 such as borophosphosilicate (BSPG) or phosphosilicate glass (PSG), a thin film resistor 108 which can be formed of chromium-silicon (CrSi), tantalum nitride (TaN), and other suitable materials, a dielectric overcoat 110, metal contacts 112 for the thin film resistor 108, and a metal contact 116 for an active device (not shown). Generally, the process of forming the integrated circuit 100 includes the step of forming the LOCOS layer 106 and active device, depositing the glass layer 106 on the LOCOS layer 104, depositing and patterning the resistive material (e.g. CrSi) to form the thin film resistor 108, depositing the dielectric overcoat 110, and forming the contacts 112 for the thin film resistor 108 and the contact 116 for the active device.

There are several undesirable characteristics of the conventional integrated circuit 100. First, the thin film resistor 108 is disposed over two dielectric layers, i.e. the LOCOS layer 104 and the glass layer 106. As it was previously stated, to achieve precise laser trimming, a well-controlled dielectric thickness is required under the thin film resistor 108. In the conventional integrated circuit 100, however, there are two dielectric layers. It is relatively difficult to control the thickness of two dielectric layers since two variables are involved. Second, another undesirable characteristic of the conventional integrated circuit 100 is that contacts 112 for the thin film resistor 108 are made directly to the resistor 108. Since the thickness of the thin film resistor 108 can be on the order of 50 to 100 Angstroms, the etching of the dielectric overcoat 110 to form the contacts 112 often results in the etching away of the thin film resistor 108 underlying the contacts 112.

Thus, there is a need for a method of forming a thin film resistor that has improved laser trimming capability, and whose formation process is less prone to defects resulting from the formation of the contacts for the thin film resistor. Such improved method, among other aspects of the invention, is provided herein in accordance with the invention.

SUMMARY OF THE INVENTION

A new and improved method of forming a thin film resistor is provided herein that overcomes many of the drawbacks of prior art methods. More specifically, the new method of forming a thin film resistor provides for a well-controlled dielectric thickness under the thin film resistor which is useful for laser trimming purpose. The preferred thickness of the dielectric layer is approximately an integer of a quarter wavelength of the optical energy used to laser trim the resistor. The new method also provides contacts to the thin film resistor that do not directly contact the thin film resistor so as to prevent any adverse process effects to the thin film resistor.

More specifically, the method of forming a thin film resistor comprises the steps of forming a pair of spaced-apart polysilicon islands over a semiconductor substrate, forming a dielectric layer over and between the polysilicon islands, forming contact holes through the dielectric layer to expose respective first regions of the polysilicon islands, forming a layer of thin film resistive material that extends between respective first regions of the polysilicon islands, forming another dielectric layer over the polysilicon islands and over the thin film resistive material layer, and forming metal contacts through the second dielectric layer in a manner that they make contact to respective second regions of the polysilicon islands, wherein the first and second regions of the polysilicon islands are different.

Alternatively, the new method may further include forming a silicide layer between the polysilicon islands and the thin film resistor. This silicide layer can be formed by depositing a refractory metal and heat treating the refractory metal so that it reacts with a portion of the polysilicon to form silicide. The refractory metal can include cobalt, titanium, vanadium, nickel, etc. Also, as previously stated, the dielectric layer between the thin film resistor and the semiconductor substrate has a thickness of approximately an integer of a quarter wavelength of an optical energy used to laser trim the thin film resistor. This thickness optimizes the laser trimming of the thin film resistor. The dielectric layer can comprise an oxide or other suitable dielectric material. Further, the thin film resistive material can include chromium-silicon (CrSi), tantalum nitride (TaN), or other suitable thin film resistive material.

In addition to the formation of the thin film resistor, other integrated circuit structures and/or devices can be formed in combination with the thin film resistor. For instance, a shallow trench isolation can be formed within the semiconductor substrate. Additionally, an active device can be formed at least in part within the semiconductor substrate, isolated by the shallow trench. The active device can comprise a metal oxide field effect transistor (MOSFET), a complimentary MOSFET (CMOS), bipolar type transistors, diodes, and other semiconductor devices. Also, a Schottky diode can be formed using the same or different silicide layer used to line the polysilicon islands where the thin film resistor makes electrical contact. The silicide layer makes contact with the semiconductor substrate to form the Schottky diode.

Other aspects and features of the invention will be apparent in view of the following detailed description of the invention including the accompanying drawings.

DETAILED DESCRIPTION OF THE INVENTION

Figure 1:
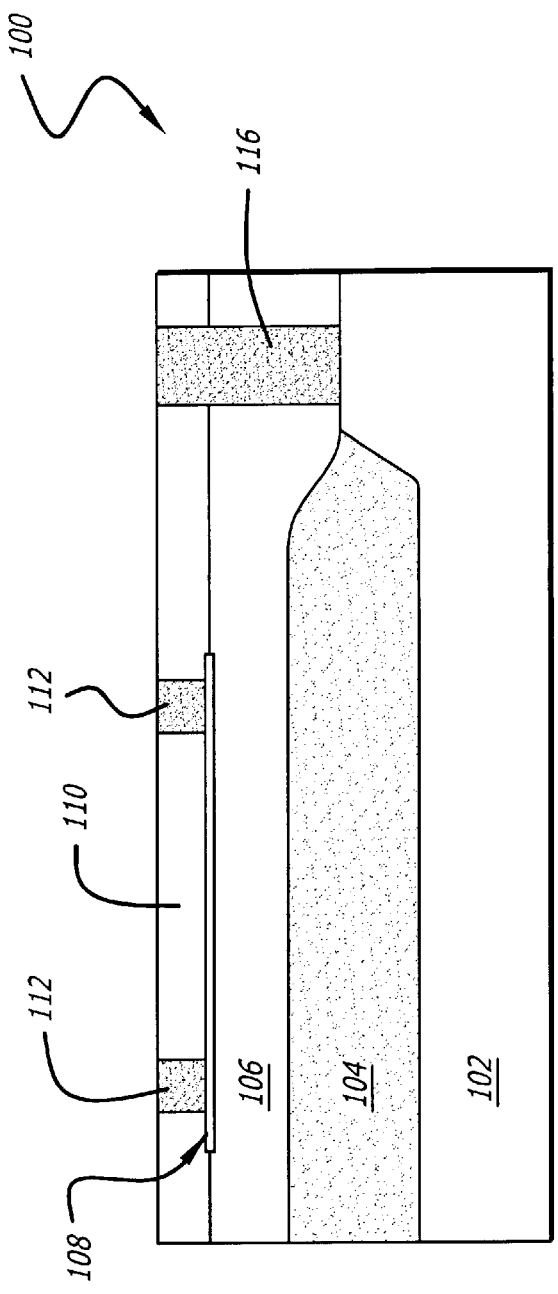
FIG. 1 illustrates a side cross-sectional view of an exemplary integrated circuit having a thin film resistor formed in a conventional manner.
Figure 2A:
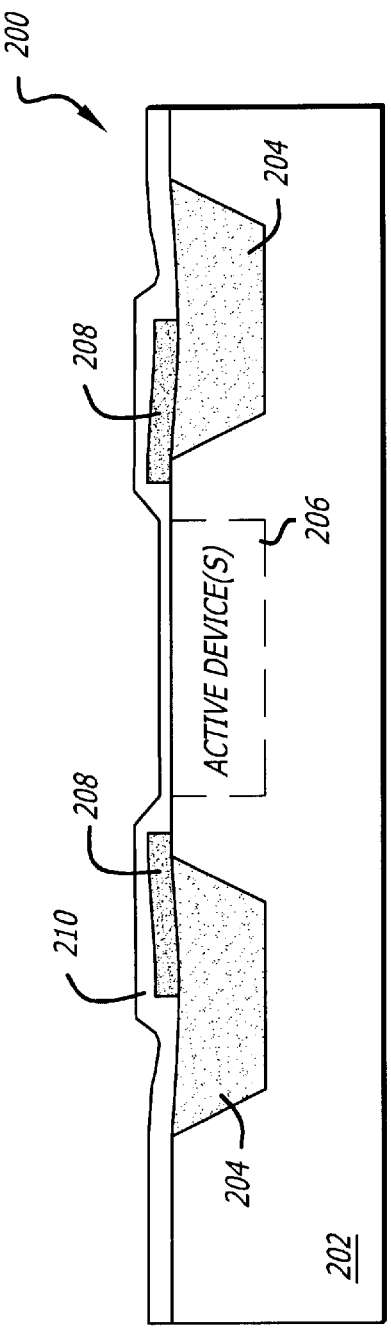
FIG. 2A illustrates a side cross-sectional view of an exemplary integrated circuit in a intermediate stage of a method of forming the integrated circuit in accordance with the invention.

FIG. 2A illustrates a side cross-sectional view of an exemplary integrated circuit 200 in an intermediate stage of a method of forming the integrated circuit in accordance with the invention. The method can begin with the formation of shallow trench isolations (STI) 204 on either side of one or more active device(s) 206, all of which are formed within a semiconductor substrate 202. The semiconductor substrate 202 can be made of any semiconductor material, including silicon, silicon-oninsulator, and others. The shallow trench isolations (STI) 204 can be made in many ways, including using conventional methods. The one or more active device (s) 206 can include a metal-oxide semiconductor field effect transistor (MOSFET), a complimentary MOSFET (i.e. CMOS), and or a bipolar transistor, a diode or other pn-junction device, or other types of semiconductor devices.

Once the shallow trench isolations (STI) 204 and active device(s) 206 are formed, a layer of doped polycrystalline silicon (referred to herein as "polysilicon") is formed on the surface of the substrate 202 including over the shallow trench isolations (STI) 204. The doped and/or optionally silicided polysilicon layer is patterned to form polysilicon islands 208 disposed on at least a portion of respective shallow trench isolations (STI) 204. As will be discussed in more detail later, each polysilicon island 208 will include a portion for electrical connection to the thin film resistor, and another portion for electrical connection to an overlying metal contact. The same layer of doped polysilicon can be used to form a gate electrode for a MOSFET and/or CMOS as part of the active device(s) 206.

Once the polysilicon islands 208 are formed, an oxide layer 210 (i.e. a dielectric layer) is formed over the substrate 202 including over the shallow trench isolations (STI) 204, the active device(s) 206, and the polysilicon islands 208. As will be explained in more detail later, the thin film resistor will be disposed over the oxide layer 210. The oxide layer 210 serves to separate the thin film resistor a particular distance from the substrate 202 to optimize the laser trimming of the thin film resistor. During laser trimming of the thin film resistor, some of the optical energy passing through the thin film resistor reflects off the surface of the substrate 202. This reflected optical energy also helps in the trimming of the thin film resistor. In order to most efficiently use the reflected optical energy for trimming purpose, the thickness of the oxide layer 210 is approximately an integer quarter wavelength (i.e. n/4, where n is 1, 2 ,3, etc.) of the optical wavelength of the laser used for trimming.

Figure 2B:
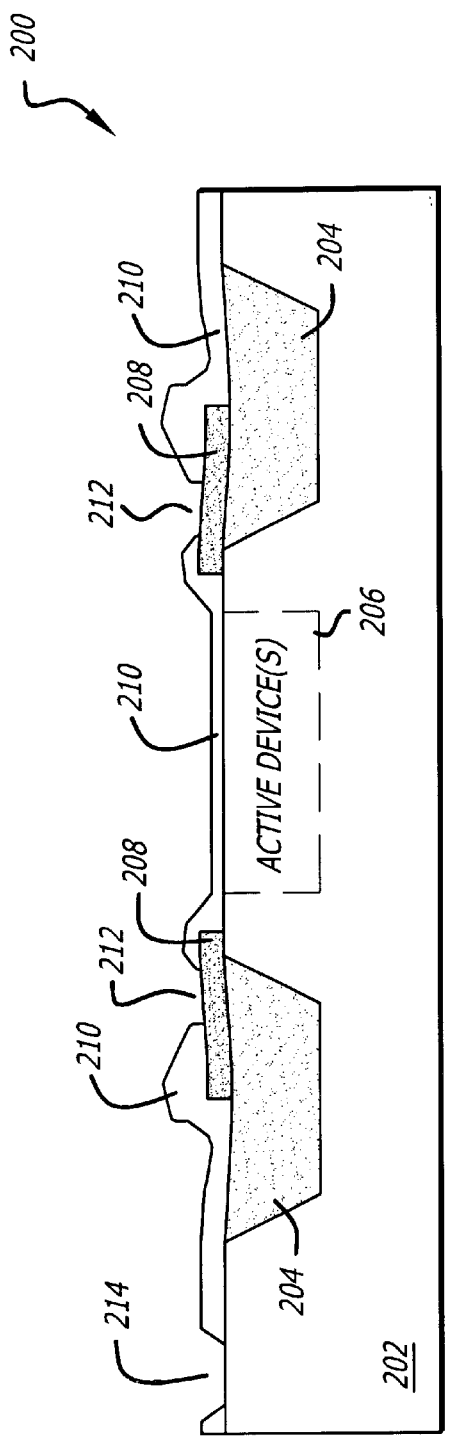
FIG. 2B illustrates a side cross-sectional view of an exemplary integrated circuit in a subsequent stage of the method of forming the integrated circuit in accordance with the invention.

FIG. 2B illustrates a side cross-sectional view of the exemplary integrated circuit 200 in a subsequent stage of the method of forming the integrated circuit in accordance with the invention. Once the oxide layer 208 has been formed, contact holes 212 to respective polysilicon islands 208 are formed. As will be explained in more detail later, in the formation of the thin film resistor, thin film resistive material will be formed within the contact holes 212 to provide an electrical connection of the polysilicon islands 208 to the thin film resistor. Optionally, another contact hole 214 may be formed through the oxide layer 210 to expose the underlying semiconductor substrate. Within the contact hole 214, a Schottky diode can be formed. In the preferred implementation of the method, the contact holes 212 and 214 are sloped to ensure good step coverage. This can be accomplished by using isotropic etching.

Figure 2C:
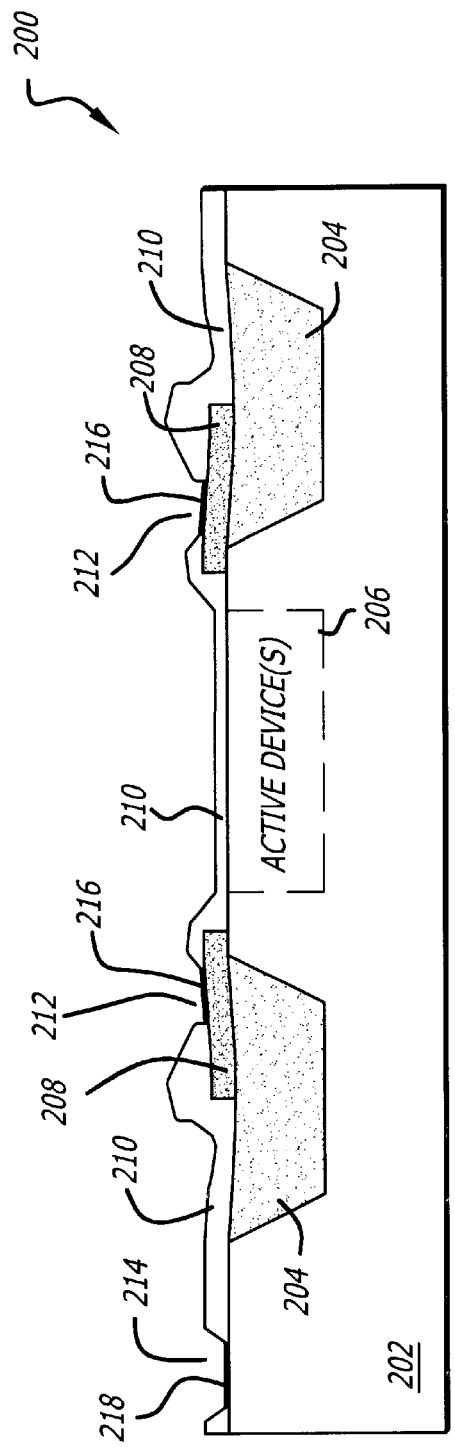
FIG. 2C illustrates a side cross-sectional view of an exemplary integrated circuit in a subsequent stage of the method of forming the integrated circuit in accordance with the invention.

FIG. 2C illustrates a side cross-sectional view of the exemplary integrated circuit 200 in a subsequent stage of the method of forming the integrated circuit in accordance with the invention. Once the contact holes 212 and 214 are formed, silicide layers 216 and 218 can be optionally formed within the contact holes 212 and 214, over the polysilicon islands 208 and the semiconductor substrate 202, respectively. This is optional for the diode, if polysilicon is already included. This step can be accomplished by depositing a refractory metal, such as cobalt, titanium, vanadium, nickel, etc., patterning the non-reacted metal to form metal islands over the polysilicon islands 208 and substrate 202, and heating to form the silicide layers 216 and 218. The advantage of using silicide instead of metal to form the Schottky diode is that contact to silicide can be wet-etched; this is less damaging than the dry etched contact through a thick dielectric.

Figure 2D:
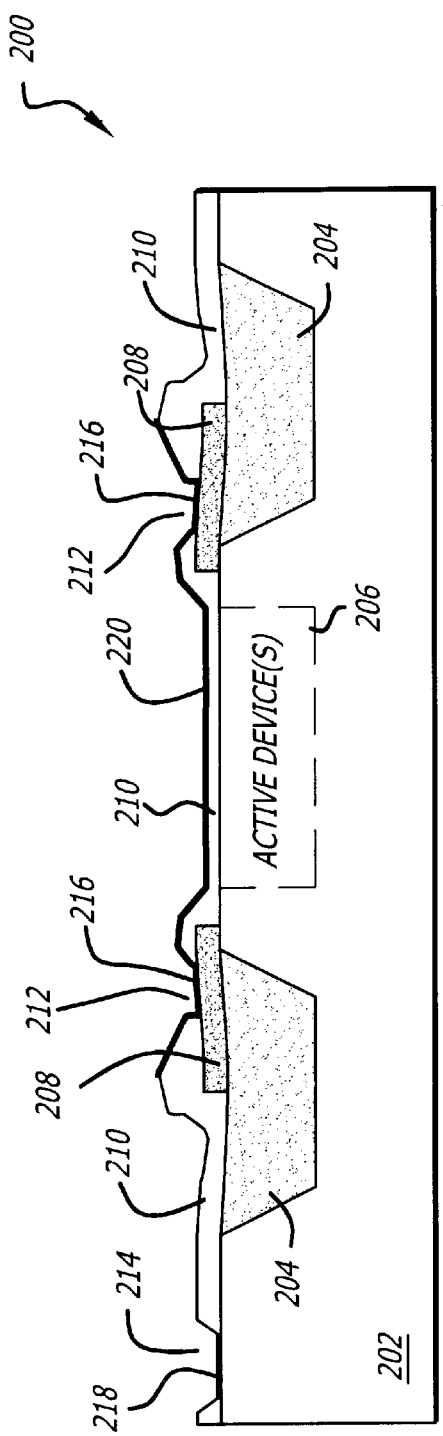
FIG. 2D illustrates a side cross-sectional view of an exemplary integrated circuit in a subsequent stage of the method of forming the integrated circuit in accordance with the invention.

FIG. 2D illustrates a side cross-sectional view of the exemplary integrated circuit 200 in a subsequent stage of the method of forming the integrated circuit in accordance with the invention. Once the silicides 216 and 218 are formed, a layer of thin film resistive material is deposited over the oxide layer 208 and over the silicide 216 within the contact holes 212, and then patterned to form the thin film resistor 220. The thin film resistor 220 makes contact to the polysilicon islands 208 by way of the suicides 216. The thin film resistive material can be any type of resistive material, including chromium-silicon (CrSi), tantalum nitride (TaN), and other suitable materials.

Figure 2E:
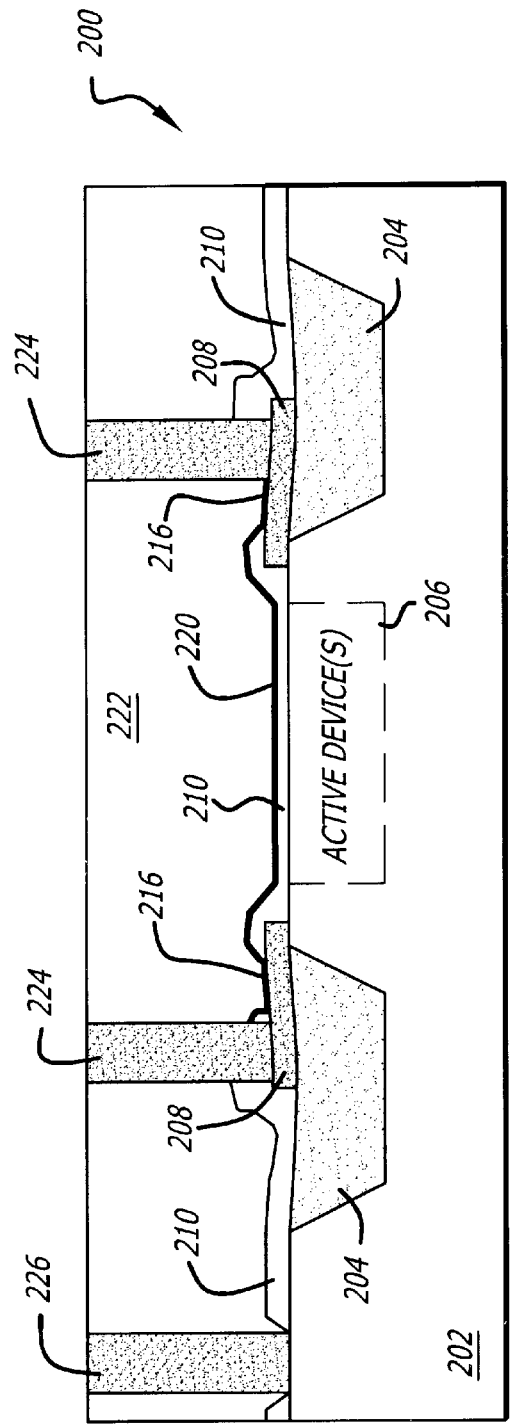
FIG. 2E illustrates a side cross-sectional view of an exemplary integrated circuit in a subsequent stage of the method of forming the integrated circuit in accordance with the invention.

FIG. 2E illustrates a side cross-sectional view of the exemplary integrated circuit 200 in a subsequent stage of the method of forming the integrated circuit in accordance with the invention. Once the thin film resistor 220 has been formed, a dielectric layer 222 and metal contacts 224 and 226 are formed through the dielectric layer 222 to make electrical connection to both sides of the thin film resistor 220 and the Schottky diode. Each metal contact 224 makes contact with corresponding polysilicon island 208 at region different than the region which the thin film resistor 220 makes contact to the polysilicon 208. The dielectric layer 222 can be made of undoped glass/phosphosilicate glass (PSG) stack, and is subsequently planarized by chemical-mechanical polishing (CMP).

The method of forming the integrated circuit including the thin film resistor has several advantages. For instance, the thin film resistor 220 is disposed over a single dielectric layer (i.e. oxide layer 210), and therefore, a better control of the dielectric thickness can be achieved which is useful for reliable laser trimming of the resistor 220. Another advantage is that the metal contacts 224 to the thin film resistor 220 does not contact directly the thin film resistor 220, but makes electrical connection thereto by way of the polysilicon islands 208. This method prevents the eroding of the thin film resistor 220 by the contact etch if the contacts 224 were made directly over the thin film resistor 220. Yet, another advantage is that silicide is formed in the formation of the Schottky diode, where the opening to silicide can be wet etched as opposed to dry etched. Wet etching is preferred since it does not affect the underlying semiconductor substrate 202 as much as dry etching.

In the foregoing specification, the invention has been described with reference to specific embodiments thereof. It will, however, be evident that various modifications and changes may be made thereto departing from the broader spirit and scope of the invention. The specification and drawings are, accordingly, to be regarded in an illustrative rather than a restrictive sense.

It is claimed:

1. A method of forming a thin film resistor, comprising:
   forming a pair of spaced-apart polysilicon islands over a semiconductor substrate;
   forming a first dielectric layer over said pair of polysilicon islands and over said semiconductor substrate between said pair of polysilicon islands;
   forming first contact holes through said first dielectric layer to expose respective first regions of said polysilicon islands;
   forming a layer of thin film resistive material over respective first regions of said polysilicon islands and over said first dielectric layer between said pair of polysilicon islands;
   forming a second dielectric layer over said polysilicon islands and over said thin film resistive material layer;
   forming second contact holes through said first and second dielectric layers to expose respective second regions of said polysilicon islands, wherein said first regions are different than said second regions of said polysilicon islands; and
   forming metal contacts within said second contact holes.

2. The method of claim 1, further including forming a silicide layer within each first contact hole, between said polysilicon islands and said thin film resistive material.

3. The method of claim 2, wherein said silicide layer is formed by depositing a refractory metal and heat treating said refractory metal.

4. The method of claim 3, wherein said refractory metal includes vanadium, titanium, cobalt or nickel.

5. The method of claim 1, wherein a thickness of said first dielectric layer is approximately an integer of a quarter wavelength of an optical energy used to laser trim said thin film resistive material.

6. The method of claim 5, wherein said first dielectric layer comprises an oxide.

7. The method of claim 1, wherein said thin film resistive material comprises chromium-silicon (CrSi).

8. The method of claim 1, further comprising forming a shallow trench isolation within said semiconductor substrate below respective portions of said polysilicon islands.

9. The method of claim 8, further comprising forming an active device at least in part within said semiconductor substrate enclosed by said shallow trench isolation.

10. The method of claim 9, wherein said active device comprises a complimentary metal oxide field effect transistor.

11. An integrated circuit, comprising:
    a semiconductor substrate;
    a pair of spaced-apart polysilicon islands over said semiconductor substrate;
    a first dielectric layer disposed over at least a portion of each of said polysilicon islands, and over said semiconductor substrate between said pair of polysilicon islands;
    a thin film resistive layer disposed over said first dielectric layer between said pair of polysilicon islands, wherein said thin film resistive layer is electrically coupled to said polysilicon islands by way of respective contact holes through said first dielectric layer situated over respective first regions of said polysilicon islands; and
    a second dielectric layer disposed over at least a portion of said polysilicon islands; and
    metal contacts to respective polysilicon islands situated over respective second regions of said polysilicon islands, wherein said second regions are different than respective first regions of said polysilicon islands.

12. The integrated circuit of claim 11, further including a silicide layer within each first contact hole, between each said polysilicon islands and said thin film resistive layer.

13. The integrated circuit of claim 12, wherein said silicide layer comprises vanadium, titanium, cobalt or nickel.

14. The integrated circuit of claim 11, wherein a thickness of said first dielectric layer is approximately an integer of a quarter wavelength of an optical energy used to laser trim said thin film resistive layer.

15. The integrated circuit of claim 14, wherein said first dielectric layer comprises an oxide.

16. The integrated circuit of claim 11, wherein said thin film resistive layer comprises chromium-silicon (CrSi).

17. The integrated circuit of claim 11, further comprising a shallow trench isolation within said semiconductor substrate below respective portions of said polysilicon islands.

18. The integrated circuit of claim 17, further comprising an active device situated at least in part within said semiconductor substrate enclosed by said shallow trench isolation.

19. The integrated circuit of claim 18, wherein said active device comprises a complimentary metal oxide field effect transistor.

20. A method of forming an integrated circuit, comprising:
    forming a pair of spaced-apart polysilicon islands over a semiconductor substrate;

forming a first dielectric layer over said pair of polysilicon islands and over said semiconductor substrate including between said pair of polysilicon islands;

forming first contact holes through said first dielectric layer to expose respective first regions of said polysilicon islands;

forming a second contact hole through said first dielectric layer to expose said semiconductor substrate;

forming first silicide layers within said first contact holes over said respective polysilicon islands;

forming a second silicide layer within said second contact hole over said semiconductor substrate to form a Schottky diode;

forming a layer of thin film resistive material over respective first regions of said polysilicon islands and over said first dielectric layer between said pair of polysilicon islands;

forming a second dielectric layer over said polysilicon islands, said thin film resistive material layer, and said second silicide layer;

forming third contact holes through said first and second dielectric layers to expose respective second regions of said polysilicon islands, wherein said first regions are different than said second regions of said polysilicon islands;

forming a fourth contact hole through said second dielectric layer to expose said second silicide layer; and forming metal contacts within said third and fourth contact holes.

21. The method of claim 20, wherein said first and second silicide layers are formed by depositing a refractory metal and heat treating said refractory metal.

22. The method of claim 21, wherein said refractory metal includes vanadium, titanium, cobalt or nickel.

23. The method of claim 20, wherein a thickness of said first dielectric layer is approximately an integer of a quarter wavelength of an optical energy used to laser trim said thin film resistor.

24. The method of claim 23, wherein said first dielectric layer comprises an oxide.

25. The method of claim 20, wherein said thin film resistive material comprises chromium-silicon (CrSi).

26. The method of claim 20, further comprising forming a shallow trench isolation within said semiconductor substrate below respective portions of said polysilicon islands.

27. The method of claim 26, further comprising forming an active device at least in part within said semiconductor substrate isolated by said shallow trench isolation.

28. The method of claim 27, wherein said active device comprises a complimentary metal oxide field effect transistor.

29. A method of forming a thin film resistor, comprising:

forming a pair of spaced-apart electrically conductive islands over a substrate;

forming a first dielectric layer over said pair of polysilicon islands and over said substrate between said electrically conductive islands;

forming first contact holes through said first dielectric layer to expose respective first regions of said electrically conductive islands;

forming a layer of thin film resistive material over respective first regions of said electrically conductive islands and over said first dielectric layer between said pair of polysilicon islands;

forming a second dielectric layer over said electrically conductive islands and over said thin film resistive material layer;

forming second contact holes through said first and second dielectric layers to expose respective second regions of said electrically-conductive islands, wherein said first regions are different than said second regions of said polysilicon islands; and forming electrically-conductive contacts within said second contact holes.

* * * * *